(12) United States Patent
Popp et al.

(10) Patent No.: US 8,294,188 B2
(45) Date of Patent: Oct. 23, 2012

(54) 4 $F^2$ MEMORY CELL ARRAY

(75) Inventors: Martin Popp, Dresden (DE); Till Schloesser, Dresden (DE)

(73) Assignee: Qimonda AG, Munich (DE)

( * ) Notice: Subject to any disclaimer, the term of this patent is extended or adjusted under 35 U.S.C. 154(b) by 1023 days.

(21) Appl. No.: 12/252,826

(22) Filed: Oct. 16, 2008

(65) Prior Publication Data

US 2010/0097835 A1    Apr. 22, 2010

(51) Int. Cl.
*G11C 5/06* (2006.01)
*G11C 11/24* (2006.01)

(52) U.S. Cl. ...................................... 257/296

(58) Field of Classification Search .............. 257/296, 257/390, 391, 392, 295, 211, 68, E21.646–E21.656, 257/E21.658, E21.659, E27.084–E27.086, 257/208, E21.657, 202, 71; 365/63, 72, 145, 365/149

See application file for complete search history.

(56) References Cited

U.S. PATENT DOCUMENTS

| | | | |
|---|---|---|---|
| 5,502,320 A | 3/1996 | Yamada | |
| 6,035,355 A | 3/2000 | Kelley et al. | |
| 6,191,975 B1 | 2/2001 | Shimizu et al. | |
| 6,274,453 B1 | 8/2001 | Schlosser et al. | |
| 6,410,948 B1 | 6/2002 | Tran et al. | |
| 6,419,948 B2 | 7/2002 | Blume et al. | |
| 6,545,904 B2 | 4/2003 | Tran | |
| 6,621,110 B1* | 9/2003 | Matsuoka et al. | 257/296 |
| 6,635,918 B1 | 10/2003 | Narui et al. | |
| 6,735,132 B2 | 5/2004 | Siek | |
| 6,785,157 B2 | 8/2004 | Arimoto et al. | |
| 6,867,994 B2 | 3/2005 | Tsukikawa | |
| 6,894,915 B2 | 5/2005 | Tran | |
| 7,020,039 B2 | 3/2006 | Tran et al. | |
| 7,035,128 B2 | 4/2006 | Yamasaki et al. | |
| 7,139,184 B2* | 11/2006 | Schloesser | 365/53 |
| 2004/0173838 A1 | 9/2004 | Ichise et al. | |
| 2004/0184298 A1 | 9/2004 | Takahashi et al. | |

FOREIGN PATENT DOCUMENTS

| | | |
|---|---|---|
| KR | 1019950003402 B1 | 4/1995 |
| TW | 200425154 | 11/2004 |
| WO | 0101489 | 1/2001 |

* cited by examiner

*Primary Examiner* — Dao H Nguyen
*Assistant Examiner* — Tram H Nguyen
(74) *Attorney, Agent, or Firm* — Edell, Shapiro & Finnan, LLC

(57) ABSTRACT

An integrated circuit including a memory cell array comprises active area lines, bitlines, the bitlines being arranged so that an individual one intersects a plurality of the active area lines to form bitline-contacts, respectively, the bitlines being arranged at a bitline pitch, wordlines being arranged so that an individual one of the wordlines intersects a plurality of the active area lines, and an individual one of the wordlines intersects a plurality of the bitlines, the wordlines being arranged at a wordline pitch, wherein neighboring bitline-contacts, each of which is connected to one of the active area lines, are connected with different bitlines, and the bitline pitch is different from the wordline pitch.

46 Claims, 7 Drawing Sheets

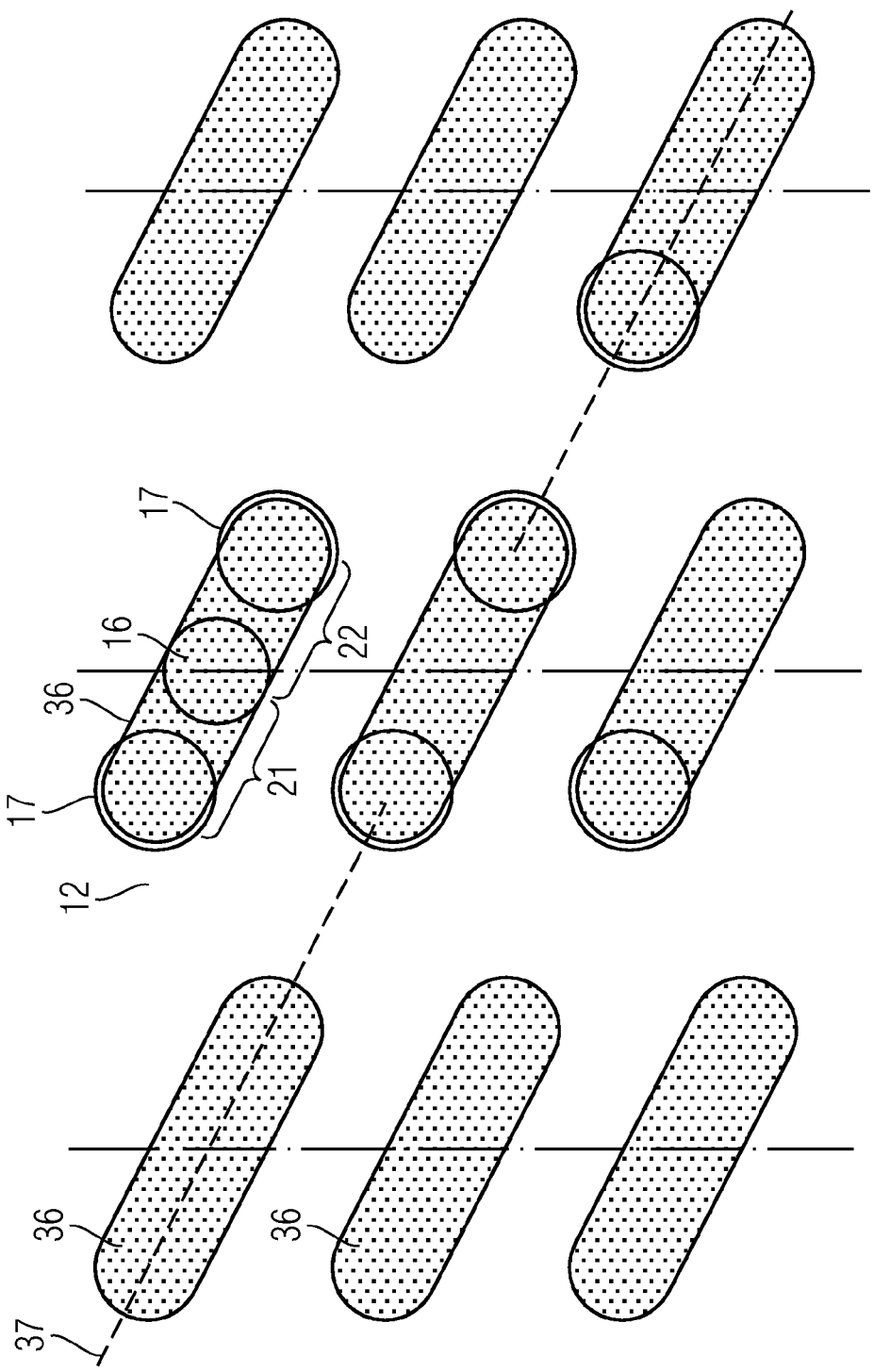

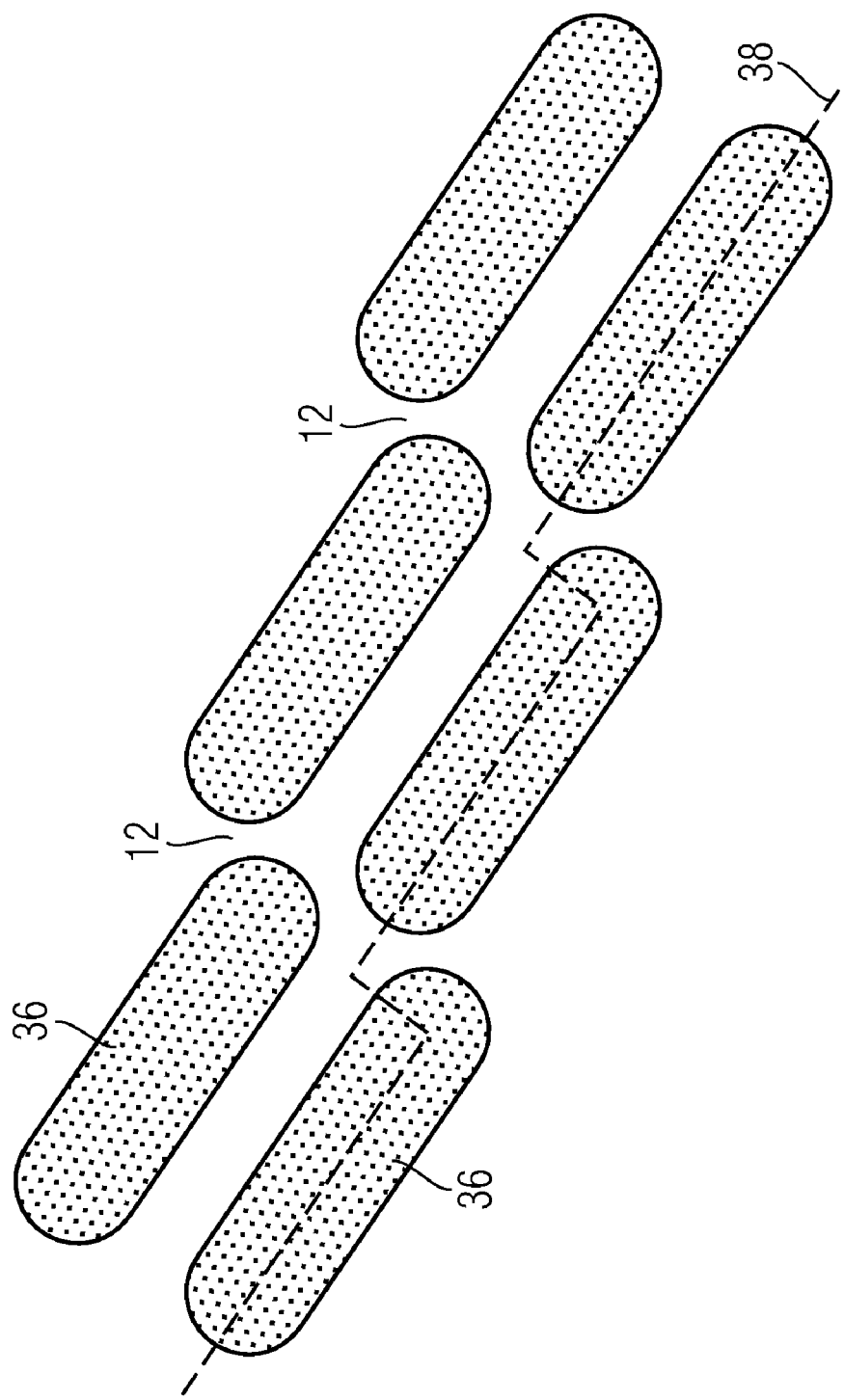

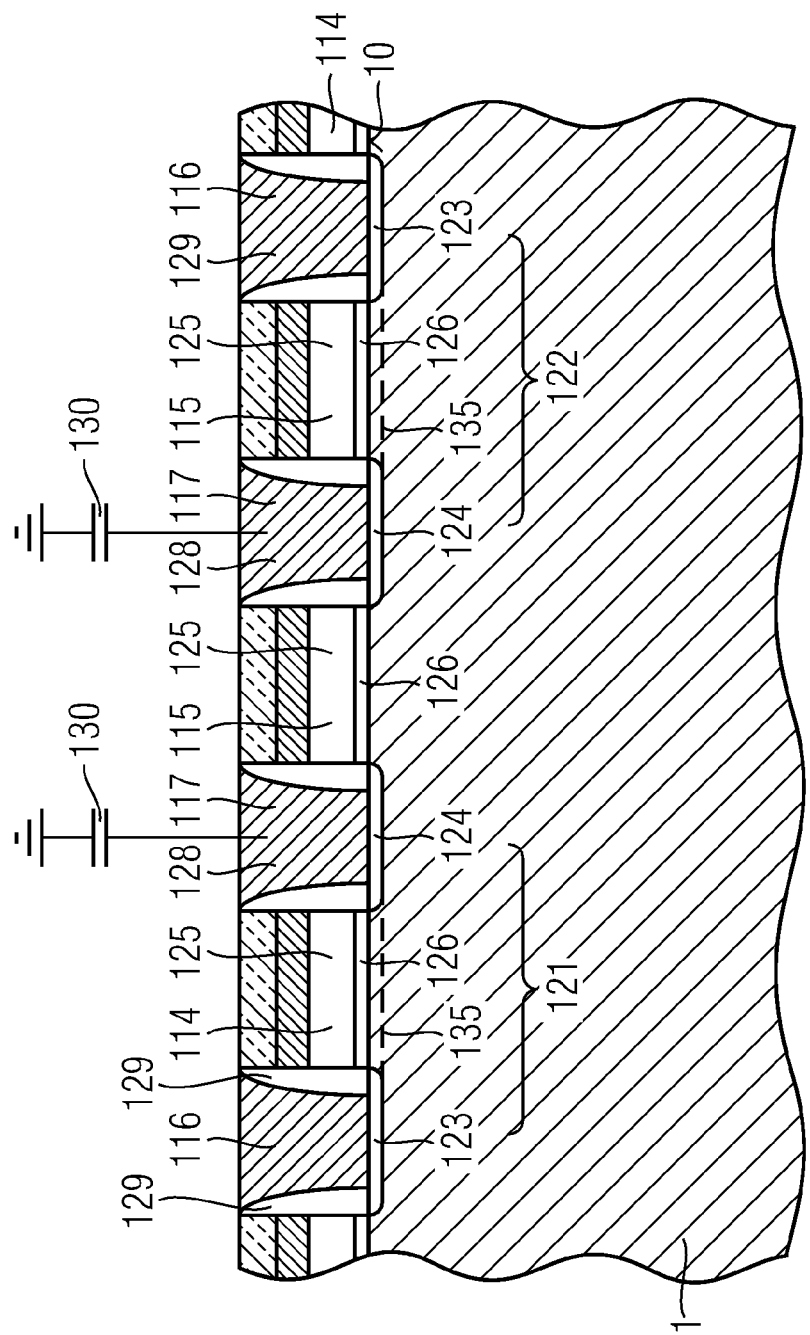

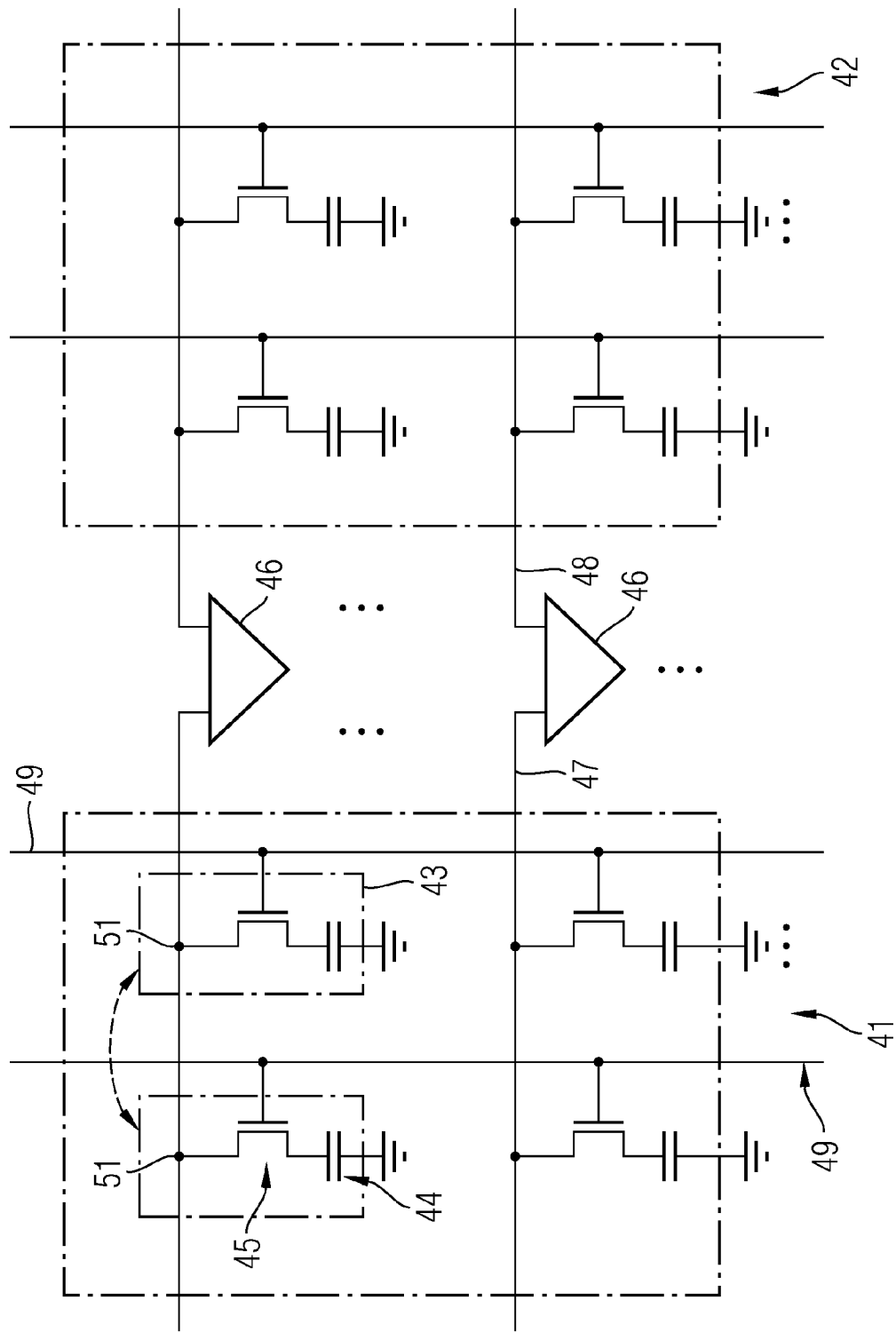

4 F² MEMORY CELL ARRAY

FIELD OF THE INVENTION

The present specification relates to an integrated circuit including a memory cell array comprising wordlines and bitlines, wherein a wordline pitch is different than a bitline pitch.

BACKGROUND

Memory cell arrays generally comprise active areas in which components of the memory cells are disposed. For example, the access transistor of a DRAM (dynamic random access memory) cell may be disposed in such an active area. Adjacent active areas may be separated from each other by isolation trenches that may be filled with an insulating material. A memory cell array further comprises word lines for controlling a read or a write operation as well as bit lines for transmitting information that is stored in the individual memory cells.

Usually, the bit lines and the word lines are arranged so as to intersect each other. In conventional approaches, the active areas have been implemented so as to be parallel to the bit lines or to the word lines. Alternatively, the active areas may be formed so as to run in a direction that is slanted with respect to the direction of the bit lines and the word lines, respectively.

In general, there is a need for further improving memory cell arrays. For example, attempts are made in order to further increase the packaging density of memory cells.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIGS. 3A and 3B, respectively, show implementations of active areas according to embodiments;

FIG. 5 shows another cross-sectional view of an embodiment; and

FIG. 6 shows an equivalent circuit diagram of a memory cell array that is, for example, shown in FIG. 1.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. Is to be understood that other embodiments may be utilized and structural or logical changes may be made without departing from the scope defined by the claims.

Figure 1:
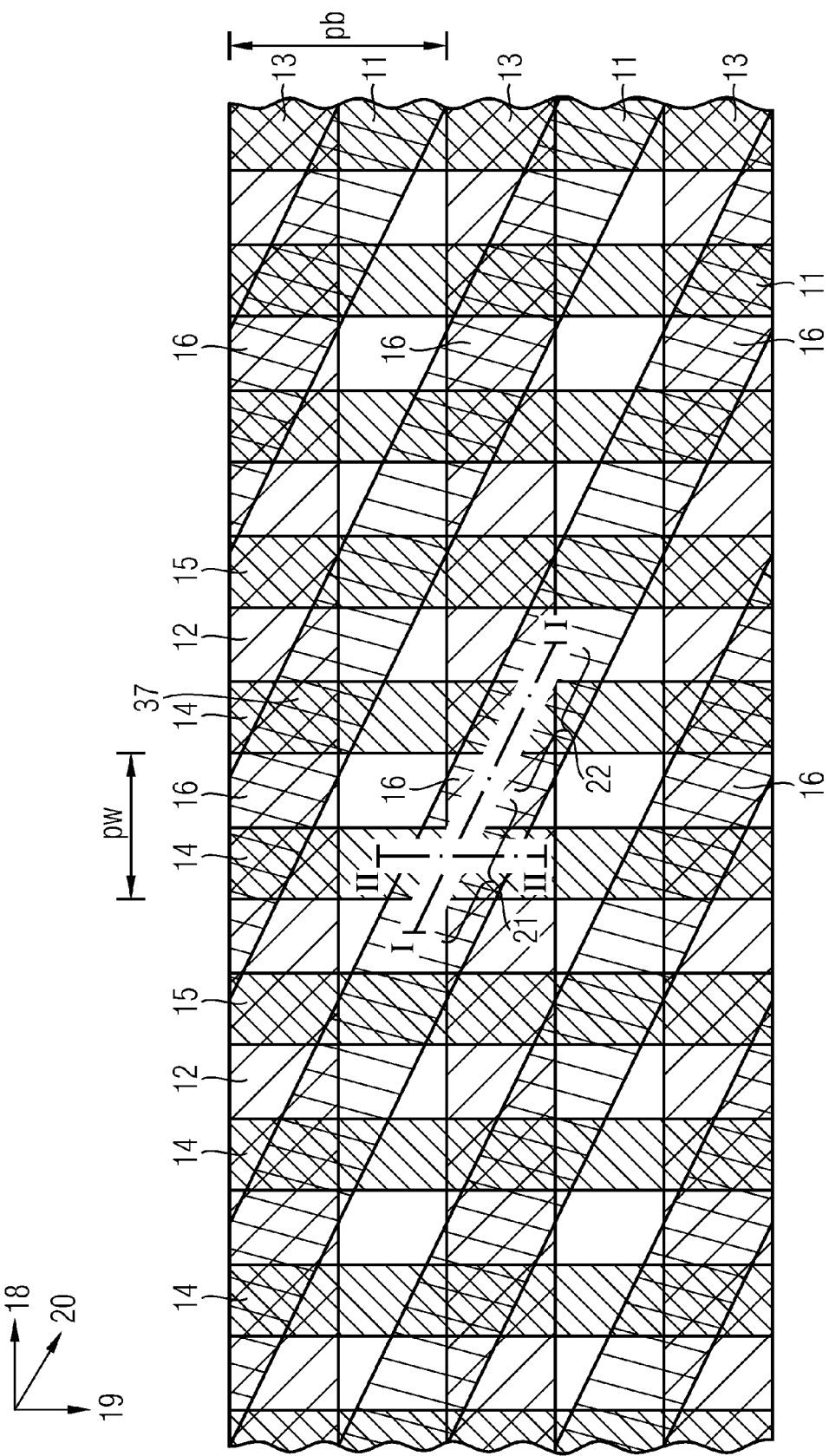
FIG. 1 shows a plan view of a memory cell array according to an embodiment.

FIG. 1 shows a plan view of an integrated circuit including a memory cell array according to an embodiment. The integrated circuit comprises active areas 12, bit lines 13 and word lines 14. The bit lines are arranged so that an individual one of the bit lines intersects a plurality of the active area lines 12 to form bit line contacts 16, respectively. The bit lines 13 are arranged at a bit line pitch pb. The word lines 14 are arranged so that an individual one of the word lines 14 intersects a plurality of the active area lines. Transistors of the memory cells may be formed in the active area lines. The active areas 12 extend in a direction that is slanted with respect to the direction of the bit lines 13 and the word lines 14. An individual one of the word lines 14 also intersects a plurality of the bit lines 13. The word lines 14 are arranged at a word line pitch pw. Neighboring bit line contacts 16 each of which is connected to one of the active area lines 12, are connected with different bit lines 13. Moreover, the bit line pitch pb is different from the word line pitch pw.

In the context of the present specification, the term "pitch" refers to the sum of the line width and the distance between adjacent lines. The line width needs not necessarily be equal to the distance or space between neighboring lines. Accordingly, the bit lines 13 are formed as an array, having a constant pitch pb. Moreover, the word lines 14 may be also arranged as an array so as to have a constant pitch pw. As is shown in FIG. 1, two word lines 14 may be followed by an isolation gate line 15. The isolation gate line 15 is capable of isolating adjacent memory cells that are assigned to the same active area line 12 from each other. For example, adjacent memory cells may be isolated by means of an isolation device comprising transistors that are operated in an off-state. For example, the gate electrodes of these isolation devices may form part of the isolation gate lines 15. Alternatively, the isolation gate line 15 may be filled with an insulating material so as to isolate adjacent memory cells from each other. Nevertheless, independent from the specific implementation of the isolation gate line, the isolation gate lines 15 are formed as part of the regular array of word lines 14. Accordingly, the isolation gate line 15 and the word lines 14 form part of a word line array at a constant pitch pw. The word line pitch pw refers to the pitch of lines extending in a second direction 19, the word line pitch pw being measured along a first direction 18. For example, the word line pitch may be smaller than the bit line pitch. For example, the word line pitch may be approximately ⅔ of the bit line pitch. Transistors 21, 22 may be arranged in the active areas. The active areas may run in a direction that is slanted with respect to the first and the second directions 18, 19.

Since the word line pitch is different from the bit line pitch, the packaging density of the memory cell array may be increased. For example, the bit line pitch may correspond to 2 F. In this respect, F denotes the minimal structural feature size or half-pitch of a pattern comprising periodic structures that may be obtained in with the lithographic methods used. For example, the word line pitch may correspond to ⅔ of the bit line pitch so that the word line pitch corresponds to 4/3 F. As a result, the size of the memory cell may correspond to 4 F×F. Accordingly, a quadratic memory cell size may be obtained.

For patterning wordlines having a word line pitch, that corresponds to ⅔ of the bit line pitch, the bit line pitch corresponding to 2 F, for example, double patterning or pitch fragmentation methods that are generally well known in the art, may be used. The term "double patterning" or "pitch fragmentation" generally refers to a patterning method by which it is possible to pattern lines having a sub-lithographic line width or line distance. This patterning method comprises lithographic patterning of a workpiece. Specific features of the various double patterning methods are generally known in the art. Accordingly, a memory cell array having such a high packaging density may be obtained using a patterning technique that employs conventional single patterning for forming the bit lines and that employs double patterning for forming the word lines. Accordingly, such a high packaging density may be obtained at comparably low cost. Due to the reduced pitch of the word lines with respect to the bit line pitch, shorter bit lines 13 may be employed for forming the memory cell array. Accordingly, the bit line to bit line capacity may be reduced, the bit line-bit line capacity being dependent from the length of the bit lines and the distance there between.

Commonly used memory devices comprise a peripheral portion, the peripheral portion including peripheral circuitry. For example word line drivers may be connected with word lines and sense amplifiers may be connected with the bit lines 13. In the embodiment shown in FIG. 1, the bit lines 13 are arranged at a comparably large pitch. Accordingly, the sense amplifiers may as well be arranged at this large pitch. Thereby, the manufacturing method of the sense amplifiers is simplified in comparison with memory devices, in which the bit lines 13 are arranged at a smaller pitch.

The memory cells of the memory cell array may be implemented as arbitrary memory cells. Examples include DRAM memory cells comprising a storage capacitor and an access transistor, phase changing memory cells (PCRAM), MRAM ("Magnetic Random Access Memories"), FERAM ("Ferroelectric Random Access Memories"), ZRAM ("Zero Capacitor Random Access Memories"), in which information is stored in a floating body transistor, and others. For example, the memory cell array may further comprise storage capacitors.

Figure 2:
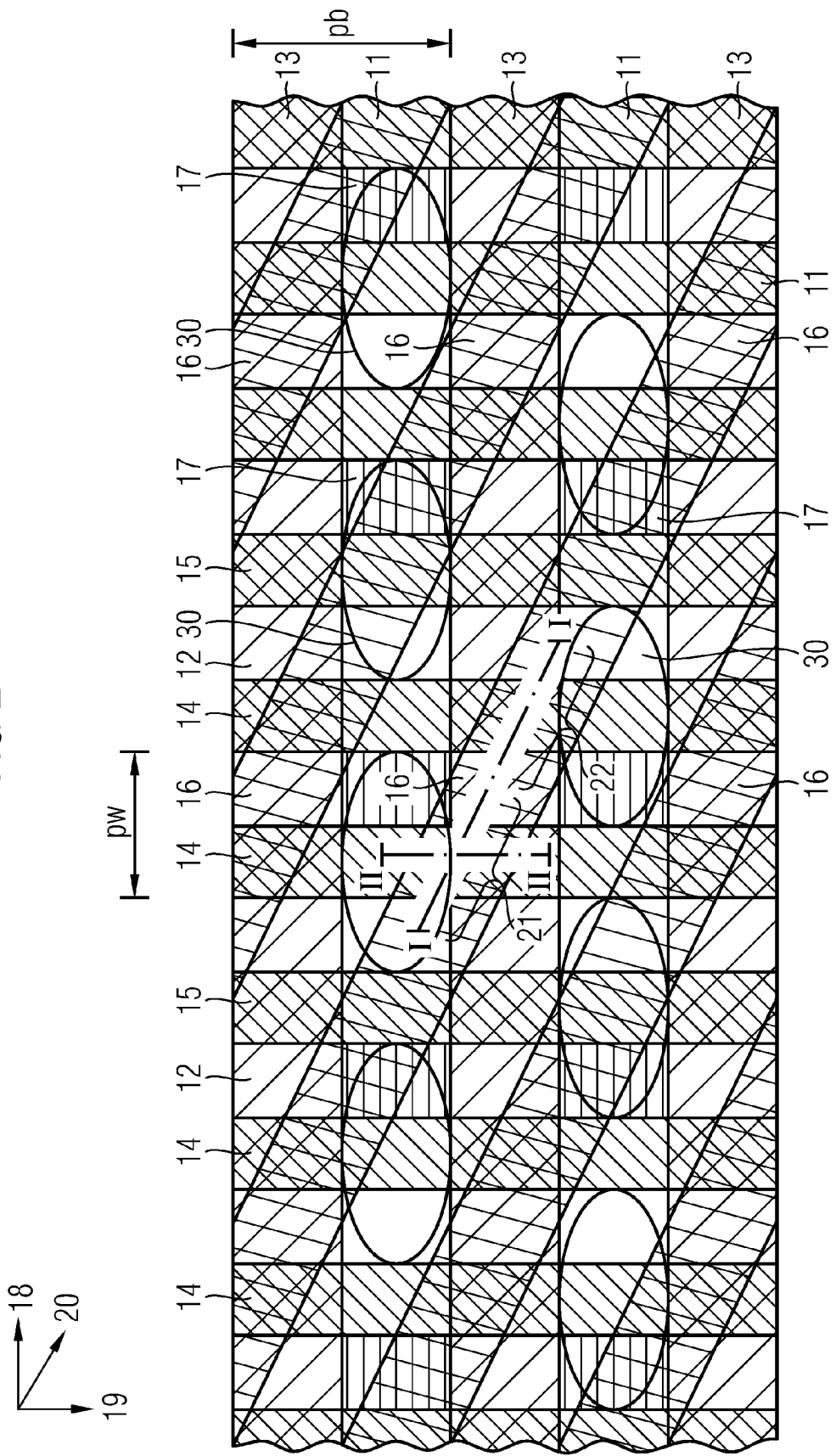
FIG. 2 shows a further plan view of a memory cell array according to an embodiment.

FIG. 2 shows an embodiment of an integrated circuit comprising a memory cell array, wherein the memory cell array further comprises storage capacitors 30. For example, these storage capacitors 30 may be formed over a surface of a semiconductor substrate. The capacitors 30 may be arranged in any arbitrary manner. For example, they may be arranged in rows and columns. For example, the may be arranged in any kind of checkerboard pattern. Moreover, the storage capacitors 30 may have an arbitrary shape. For example, they may have a circular or oval or have any other suitable shape. The shape of the storage capacitors may vary over the height of the storage capacitors. In the memory cell array shown in FIG. 2, transistors 21, 22 are formed in each of the active area lines 13. The transistors are connected via bit line contacts 16 to corresponding bit lines 13. For example, one bit line contact 16 may be associated with two neighboring transistors 21, 22 that are assigned to one active area line 13. Moreover, the memory cell array comprises capacitor contacts 17. The capacitor contacts 17 are configured to connect the transistors with corresponding capacitors 30. For example, the capacitor contacts may be disposed along lines that extend in the second direction 19. Accordingly, the capacitor contacts 17 may be disposed along a line that extends parallel to the word lines 14.

As is further shown in FIGS. 1 and 2, an integrated circuit including a memory cell array may comprise bit lines 13 that generally extend along a first direction 18, word lines running along a second direction 19 and active areas extending in a direction that is slanted with respect to the first and second directions. The bit lines 13 are arranged at a bit line pitch pb and the word lines are arranged at a word line pitch pw. Transistors 21, 22 may be formed in the active areas 21. The memory cell array may further comprise bit lines contacts 16, the bit line contacts 16 being disposed in a region that is generally defined by an intersection of a bit line 13 and a corresponding active area 12. Neighboring bit line contacts that are shifted along a direction that is slanted with respect to the first and second directions, respectively are connected with neighboring bit lines. The bit line pitch pb is different from the word line pitch pw. Accordingly, neighboring bit line contacts 16 that are assigned to one line 37, 38 of active areas are connected with neighboring bit lines 13.

Furthermore, an integrated circuit including a memory cell array may comprise bit lines 13 generally extending along a first direction 18, word lines 14 running along a second direction 19, wherein the bit lines and the word lines are connected with corresponding memory cells 43. The word lines 14 are disposed so that a bottom side of the word lines 14 is disposed below a substrate surface. Moreover, the bit line pitch pb is different from the word line pitch pw. According to this implementation, the word lines 14 are formed as buried or partially buried word lines as will be explained in the following with respect to FIG. 5.

The bit lines may be further formed as wiggled bit lines. Moreover, they can as well be formed as straight lines. As a further example, the word lines may be formed as wiggled word lines. Nevertheless, they can as well be formed as straight word lines. Moreover, an angle between the active area lines 12 and the bit lines 13 may be approximately 27°.

The active areas may be formed as straight or angled lines 11. Moreover, the active areas need not necessarily be formed as lines but they may also be formed as segmented active areas. FIG. 3A shows an embodiment of the invention in which active area segments 36 are arranged along a straight line 37. Accordingly, neighboring active area segments 36 are insulated from each by isolation trenches 12 that are filled with an insulating material. The straight line 37 is formed so as to extend a long the third direction 20. As is shown in FIG. 3A, two capacitor contacts 17 as well as one bit line contact 16 are disposed in each of the active area segments 36. Moreover, two transistors 21, 22 are arranged in each of the active area segments. Nevertheless, the active area segments 36 may as well be implemented in such a manner that a different number of transistors is arranged in each of the active area segments 36. Moreover, as is shown in FIG. 3B, the active area segments may be arranged along angled lines 38. Accordingly, the active are segments are disposed in a staggered manner.

Figure 4:
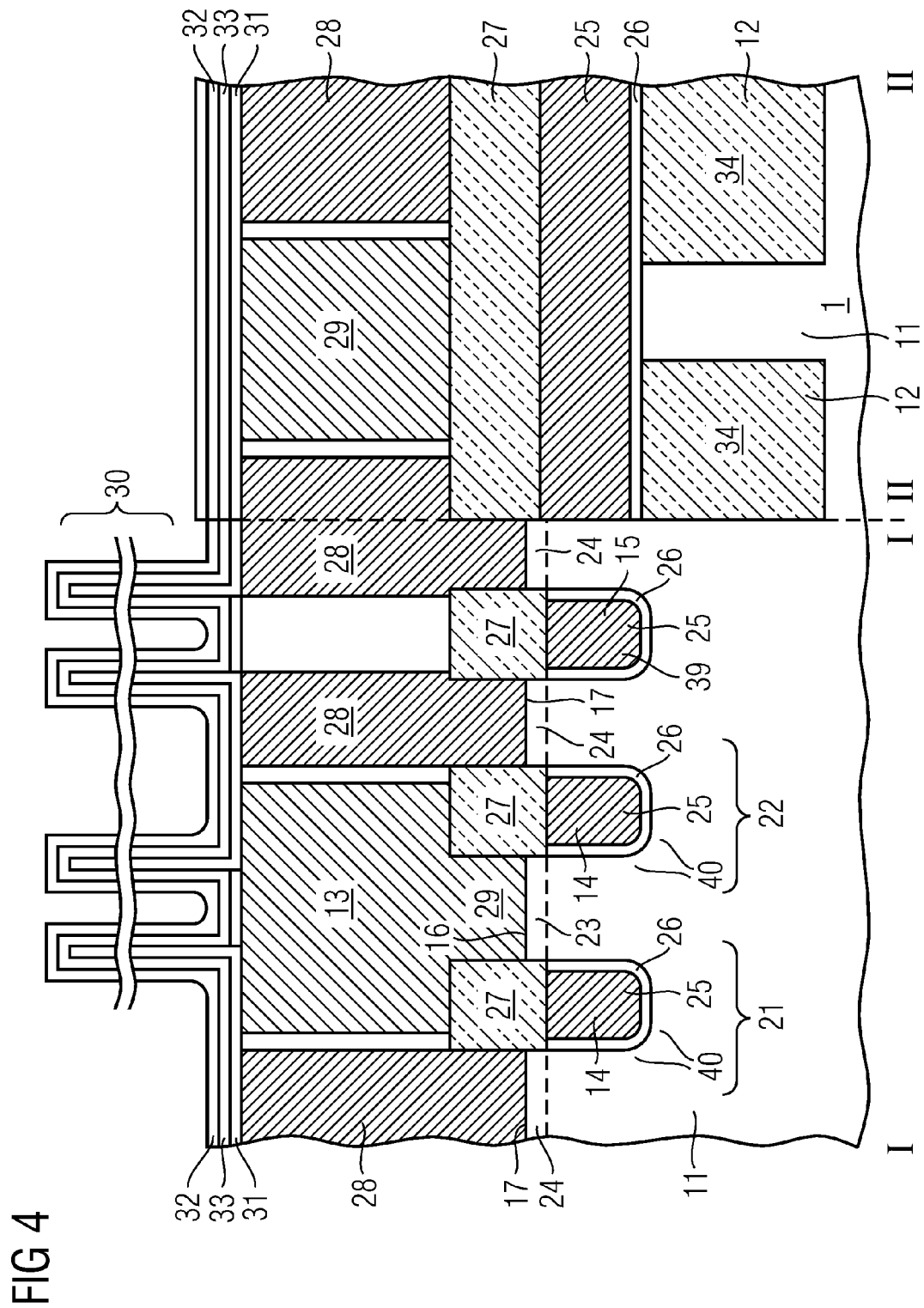
FIG. 4 shows a cross-sectional view of a memory cell according to an embodiment.

FIG. 4 shows a cross-sectional view of a memory cell forming part of the memory cell array shown in FIG. 2 according to an embodiment. The left hand side of FIG. 4 is a cross-sectional view taken between I and I, whereas the right hand part of the cross-sectional view is taken between II and II as is shown in FIG. 1, for example. Isolation trenches 12 as well as active areas 11 are formed in a substrate 1. The terms "wafer", "substrate", "semiconductor chip" or "semiconductor substrate" used in the context of the present description may include any semiconductor-based structure that has a semiconductor substrate. Wafer and substrate are to be understood to include silicon, silicon-on-insulator (SOI), silicon-on-sapphire (SOS), doped and undoped semiconductors, epitaxial layers of silicon supported by a base crystalline material, and other semiconductor structures. The semiconductor need not be silicon-based. The semiconductor could as well be, among others, silicon-germanium, germanium or gallium arsenide. Various components may already be formed in the substrate. Moreover, different layers may be embedded in the substrate material. The isolation trenches 12 may be filled with an arbitrary insulating material such as silicon oxide, silicon nitride and others as well as combinations thereof. The active areas may be segmented into active area segments in an early process step. Alternatively, the active areas 11 may be formed as continuous lines, neighboring transistors being isolated from each other by an isolation device 39.

Transistors 21, 22 are disposed in the active areas 11. Each of the transistors comprises a first source/drain portion 23 and a second source/drain portion 24. A channel region 40 is disposed between the first and the second source/drain portions 23, 24. The conductivity of the channel region 40 may be controlled by the gate electrode 25. The gate electrode 25 is disposed between the first and the second source/drain portions 23, 24. The gate electrode 25 is insulated from the channel region 40 by a gate dielectric 24. The gate dielectric may comprise any of the generally known insulating materials such as silicon oxide, silicon nitride or further dielectric materials such as high-k dielectrics and others. A gate electrode 25 may form part of a corresponding word line 14. The material of the gate electrode 25 may be arbitrary. For example, polysilicon or any suitable conductive material may be used. Examples comprise metals such as tungsten and combinations of conductive layers. The word line may be made of a material that comprises the same materials as the gate electrode 25. Moreover, the word line may be made of a material that is different from the material of the gate electrode 25. The word line 14 may be disposed so that an upper surface thereof is disposed beneath or approximately at the same height as the main surface of the semiconductor substrate 1. An insulating cap layer 27 may be disposed above the buried word line 14 or the gate electrode 25, respectively. The word lines 14 may be arranged so that they extend in the active areas 11 to approximately the same depth as in the isolation trenches 12. The first and second source/drain portions may be implemented as doped portions. In FIG. 4, two adjacent transistors 21, 22 share one common bit line contact 16.

In the embodiment shown in FIG. 4, the bit line 13 is directly adjacent to a main surface of the substrate so that the interface between semiconductor material and the conductive material 29 of the bit line 13 forms the bit line contact 16. The conductive material 29 of the bit line may be selected in an arbitrary manner. For example, the material of the bit line 13 may correspond or may be identical with the material of a gate electrode of a transistor in the peripheral portion (not shown). For example, the conductive material of the bit line 13 may comprise polysilicon. Moreover, the conductive material 29 may comprise further conductive materials, for example, a metal. As still a further example, the bit line 13 may comprise a metal only. The bit line 13 is arranged in the manner as has been explained above.

A capacitor contact 17 is arranged so as to be adjacent to second source/drain portion 24. Moreover, a conductive plug 28, for example, a polysilicon plug may be disposed so as to be in contact with the second source/drain portion 24. Moreover, a capacitor 30 is in contact with the conductive plug 28. The capacitor may be disposed above the main surface of the substrate 1. The capacitor 30 may comprise a first capacitor electrode 31, a second capacitor electrode 32 as well as a suitable capacitor dielectric 33. The materials of the capacitor electrodes 31, 32 and of the dielectric material 33 may be selected in accordance with the technological requirements. For example, the first and the second capacitor electrodes 31, 32 may comprise a metal or any other suitable conductive material. Moreover, the dielectric material 33 may be a so-called high-k dielectric. High-k materials may be defined as having a dielectric constant which is greater than the dielectric constant of silicon dioxide. Examples of high-k-materials include transition metal oxides, zirconium, hafnium-oxide, lead zirconium titanate, tantalum oxide, silicon nitride, and/or barium strontium titanate. Further examples include combinations or mixtures of any of these materials. The right hand side of FIG. 4 shows a cross-sectional view between II and II intersecting an active area 11, the view being parallel to a word line 14.

As is further shown in the left hand portion between I and I, there is an isolation device 39 that isolates a further transistor (not shown in this cross-sectional view) from transistor 22. The isolation device 39 may comprise a recess structure in the substrate that is filled with an insulating material. Alternatively, as is shown in FIG. 4, the recess structure may be formed so as to form a gate electrode 25 that is operated in an off-state so as to minimize a current flow between the doped portions 24. In the device 39, the gate electrode 25 may be insulated from the substrate material 1 by a suitable gate dielectric 26. Moreover, the gate electrode 25 of the isolation device 39 may form part of an isolation gate line 15 that may extend parallel to the word lines 14. Accordingly, isolation gate line 15 and word line 14 may be identical in construction. Likewise, the gate electrode of an access transistor and the gate electrode of the isolation device 39 may be identical in construction. Nevertheless, the isolation gate line 15 and word line 14 are held on different potentials, respectively.

FIG. 5 shows a cross-sectional view of a further memory cell which may form part of the memory cell array shown in FIG. 1 or 2 according to an embodiment. First and second access transistors 121, 122 are formed in a semiconductor substrate 1. The first access transistor 121 may comprise a first and a second source/drain region 123, 124. The first and the second source/drain portion 123, 124 may be implemented as n-doped portions. The channel region 135 may be formed in the p-doped substrate portion between the first and the second source/drain portion 123, 124. The conductivity of the channel 135 may be controlled by the gate electrode 125. The gate electrode 125 is insulated from the channel region 135 by the gate dielectric 126. The material of the gate electrode 125 may comprise any of the materials that are used as gate conductive materials such as polysilicon, tungsten and other metals. The gate electrode 125 may form part of a corresponding word line 114. As is shown in FIG. 5, the gate electrode 125 may comprise several conductive layers. The first source/drain portion 123 may be connected via a bit line contact 116 with a corresponding bit line (not shown). Moreover, the second source/drain portion 124 may be connected via a capacitor contact 117 with a corresponding storage capacitor 130.

Nevertheless, as is clearly to be understood, the memory cell is not restricted to a DRAM memory cell and other types of memory cells may as used as well as has been explained above. As is shown in FIG. 5, the conductive material of the gate electrode 125 may be disposed above the substrate surface 10. To be more specific the gate electrode 125 may be completely disposed above the substrate surface so that, as is shown in FIG. 5, a planar channel that extends along a horizontal surface of the substrate may be formed. The memory cell array shown in FIG. 5 also comprises an isolation device 139 comprising a gate electrode that may form part of a corresponding isolation gate line as has been explained above.

FIG. 6 represents an equivalent circuit diagram of a pair of a first and second memory cell arrays 41, 42 in order to illustrate an operation scheme of the memory cell array shown above. The arrays 41, 42 may be implemented in an open bit line configuration. Each of the memory cell arrays comprises memory cells 43. The memory cells 43 comprise a transistor 45 and a storage capacitor 44, respectively.

The first and second memory cell arrays 41, 42 are each coupled to respective groups of first and second bit lines 47, 48. The two groups of bit lines 47, 48 are coupled one from each of the memory cell arrays 41, 42 to sense amplifiers 46. The sense amplifier 46 may comprise peripheral circuitry. For example, this circuitry may comprise devices employed in support of memory cell arrays 41, 42 and generally formed outside the memory cell arrays 41, 42.

In operation, one memory cell 43 is selected, for example, by activating one word line 49. The word line 49 is coupled to a respective gate electrode of a respective one of the transistors 45. The bit line 47 is connected with the first source/drain region of one of these transistors 45 via the bit line contact 51. The transistor 45 is then turned on, transmitting charge stored in the capacitor 44 to the associated bit line 47. The sense amplifier 46 senses the charge coupled from the capacitor 44 to the bit line 47. The sense amplifier 46 compares this signal to a reference signal such as the reference charge Qref or a reference signal which is obtained by sensing a corresponding bit line 48, without a voltage being applied to the corresponding word line. Nevertheless, as is clearly to be understood, any alternative array architecture may be used as well.

The embodiments of the invention described in the foregoing description are examples given by way of illustration and the invention is nowise limited thereto. Any modification, variation and equivalent arrangement should be considered as being included within the scope of the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit including a memory cell array comprising:
    active area lines;
    bitlines arranged such that individual bitlines intersect a plurality of the active area lines to form bitline-contacts, respectively, the bitlines being arranged at a bitline pitch;
    wordlines arranged such that individual wordlines intersect a plurality of the active area lines, and individual wordlines intersect a plurality of the bitlines, the wordlines being arranged at a wordline pitch, wherein:
    neighboring bitline-contacts, each of which is connected to one of the active area lines, are connected with different bitlines;
    the bitline pitch is different from the wordline pitch; and
    the size of a memory cell corresponds to 4 $F^2$.

2. The integrated circuit according to claim 1, wherein the wordline pitch is smaller than the bitline pitch.

3. The integrated circuit according to claim 2, wherein the wordline pitch corresponds to ⅔ of the bitline pitch.

4. The integrated circuit according to claim 3, wherein the bitline pitch corresponds to 2 F.

5. The integrated circuit according to claim 1, wherein the active area lines are continuous active area lines that are associated with a plurality of bitline-contacts.

6. The integrated circuit according to claim 1, wherein the active area lines are straight lines.

7. The integrated circuit according to claim 1, wherein the memory cell array further comprises storage capacitors.

8. The integrated circuit according to claim 7, wherein the storage capacitors are formed over a surface of a semiconductor substrate.

9. The integrated circuit according to claim 1, wherein one bitline-contact is associated with two neighboring transistors that are assigned to one active area line.

10. The integrated circuit of claim 1, wherein the bitlines generally extend along a first direction.

11. The integrated circuit of claim 10, wherein the wordlines extend along a second direction, the second direction being perpendicular to the first direction.

12. The integrated circuit of claim 1, wherein the bitline-contacts that are associated with neighboring bitlines are arranged along one line, this line generally extending along the second direction.

13. The integrated circuit of claim 1, further comprising capacitor contacts that are configured to connect the transistors with corresponding capacitors, wherein the capacitor contacts are disposed along lines extending in the second direction.

14. The integrated circuit according to claim 1, wherein the wordlines are formed as buried wordlines.

15. The integrated circuit of claim 1, further comprising isolation gatelines which are adapted to isolate neighboring transistors from each others, the isolation gatelines being arranged in parallel with the wordlines.

16. An integrated circuit including a memory cell array comprising:
    bitlines generally extending along a first direction, the bitlines being arranged at a bitline pitch;
    wordlines running along a second direction, the wordlines being arranged at a wordline pitch;
    active areas, transistors being formed in the active areas, the active areas extending in a direction that is slanted with respect to the first and second directions,
    bitline contacts disposed in regions generally defined by an intersection of a bitline and a corresponding active area; wherein:
    neighboring bitline contacts that are shifted along a direction that is slanted with respect to the first and second directions, respectively, are connected with neighboring bitlines;
    the bitline pitch is different from the wordline pitch; and
    the size of a memory cell corresponds to 4 $F^2$.

17. The integrated circuit according to claim 16, wherein the wordline pitch is smaller than the bitline pitch.

18. The integrated circuit according to claim 17, wherein the wordline pitch corresponds to ⅔ of the bitline pitch.

19. The integrated circuit according to claim 18, wherein the bitline pitch corresponds to 2 F.

20. The integrated circuit according to claim 16, wherein the active area lines are continuous active area lines that are associated with a plurality of bitline contacts.

21. The integrated circuit according to claim 16, wherein the active area lines are straight lines.

22. The integrated circuit according to claim 16, wherein the memory cell array further comprises storage capacitors.

23. The integrated circuit according to claim 22, wherein the storage capacitors are formed over a surface of a semiconductor substrate.

24. The integrated circuit according to claim 16, wherein one bitline contact is associated with two neighboring transistors that are assigned to one active area line.

25. The integrated circuit of claim 16, wherein the bitline-contacts that are associated with neighboring bitlines are arranged along one line, this line generally extending along the second direction.

26. The integrated circuit of claim 16, further comprising capacitor contacts that are configured to connect the transistors with corresponding capacitors, wherein the capacitor contacts are disposed along lines extending in the second direction.

27. The integrated circuit according to claim 16, wherein the wordlines are formed as buried wordlines.

28. The integrated circuit of claim 16, further comprising isolation gatelines which are adapted to isolate neighboring transistors from each others, the isolation gatelines being arranged in parallel with the wordlines.

29. An integrated circuit including a memory cell array comprising:
   bitlines generally extending along a first direction, the bitlines being arranged at a bitline pitch;
   wordlines running along a second direction, the wordlines being arranged at a wordline pitch, the wordlines being disposed so that a bottom side of the wordlines is disposed below a substrate surface;
   the bitlines and the wordlines being connected with corresponding memory cells;
   wherein the bitline pitch is different from the wordline pitch, and the size of a memory cell corresponds to 4 $F^2$.

30. The integrated circuit according to claim 29, wherein the wordline pitch is smaller than the bitline pitch.

31. The integrated circuit according to claim 30, wherein the wordline pitch corresponds to $2/3$ of the bitline pitch.

32. The integrated circuit according to claim 31, wherein the bitline pitch corresponds to 2 F.

33. The integrated circuit according to claim 29, wherein the active area lines are continuous active area lines that are associated with a plurality of bitline contacts.

34. The integrated circuit according to claim 29, wherein the active area lines are straight lines.

35. The integrated circuit according to claim 29, wherein the memory cell array further comprises storage capacitors.

36. The integrated circuit according to claim 35, wherein the storage capacitors are formed over a surface of a semiconductor substrate.

37. The integrated circuit according to claim 29, wherein one bitline contact is associated with two neighboring transistors that are assigned to one active area line.

38. The integrated circuit of claim 29, wherein the bitline-contacts that are associated with neighboring bitlines are arranged along one line, this line generally extending along the second direction.

39. The integrated circuit of claim 29, further comprising capacitor contacts that are configured to connect the transistors with corresponding capacitors, wherein the capacitor contacts are disposed along lines extending in the second direction.

40. The integrated circuit of claim 29, further comprising isolation gatelines which are adapted to isolate neighboring transistors from each others, the isolation gatelines being arranged in parallel with the wordlines.

41. The integrated circuit according to claim 29, wherein an upper side of the wordlines is disposed below the substrate surface.

42. An integrated circuit including a memory cell array comprising:
   active area lines;
   bitlines arranged such that individual bitlines intersect a plurality of the active area lines to form bitline contacts, respectively, the bitlines being arranged at a bitline pitch;
   wordlines arranged such that individual wordlines intersect a plurality of the active area lines, and individual wordlines intersect a plurality of the bitlines, the wordlines being arranged at a wordline pitch, wherein:
   neighboring bitline contacts, each of which is connected to one of the active area lines, are connected with different bitlines;
   the bitline pitch is different from the wordline pitch; and
   the wordline pitch is $4/3 F$.

43. The integrated circuit according to claim 42, wherein the wordlines are buried wordlines.

44. An integrated circuit including a memory cell array comprising:
   bitlines generally extending along a first direction, the bitlines being arranged at a bitline pitch;
   wordlines running along a second direction, the wordlines being arranged at a wordline pitch;
   active areas, transistors being formed in the active areas, the active areas extending in a direction that is slanted with respect to the first and second directions,
   bitline contacts disposed in regions generally defined by an intersection of a bitline and a corresponding active area;
   wherein:
   neighboring bitline contacts that are shifted along a direction that is slanted with respect to the first and second directions, respectively, are connected with neighboring bitlines;
   the bitline pitch is different from the wordline pitch; and
   the wordline pitch is $4/3 F$.

45. The integrated circuit according to claim 44, wherein the wordlines are buried wordlines.

46. An integrated circuit including a memory cell array comprising:
   bitlines generally extending along a first direction, the bitlines being arranged at a bitline pitch;
   wordlines running along a second direction, the wordlines being arranged at a wordline pitch, the wordlines being disposed so that a bottom side of the wordlines is disposed below a substrate surface;
   the bitlines and the wordlines being connected with corresponding memory cells;
   wherein the bitline pitch is different from the wordline pitch, and the wordline pitch is $4/3 F$.

* * * * *